(12) United States Patent
Deng et al.

(10) Patent No.: US 12,327,342 B2
(45) Date of Patent: Jun. 10, 2025

(54) AUTOMATIC PARTICLE BEAM FOCUSING

(71) Applicant: FEI Company, Hillsboro, OR (US)

(72) Inventors: Yuchen Deng, Eindhoven (NL); Erik Franken, Nuenen (NL); Bart van Knippenberg, Helden (NL); Holger Kohr, Eindhoven (NL)

(73) Assignee: FEI Company, Hillsboro, OR (US)

( * ) Notice: Subject to any disclaimer, the term of this patent is extended or adjusted under 35 U.S.C. 154(b) by 576 days.

(21) Appl. No.: 17/588,048

(22) Filed: Jan. 28, 2022

(65) Prior Publication Data
US 2023/0245291 A1    Aug. 3, 2023

(51) Int. Cl.
| | | |
|---|---|---|
| G06T 7/00 | (2017.01) | |
| G01N 23/04 | (2018.01) | |
| G01N 23/06 | (2018.01) | |
| G01N 23/2251 | (2018.01) | |

(52) U.S. Cl.
CPC ............ G06T 7/0002 (2013.01); *G01N 23/04* (2013.01); *G01N 23/06* (2013.01); *G01N 23/2251* (2013.01); *G01N 2223/04* (2013.01); *G01N 2223/07* (2013.01); *G01N 2223/3307* (2013.01); *G01N 2223/418* (2013.01); *G06T 2207/10061* (2013.01)

(58) Field of Classification Search
CPC .......... H01J 37/21; H01J 37/244; H01J 37/26; H01J 37/28; H01J 37/222; H01J 2237/216; H01J 2237/221; H01J 2237/2817; H01J 2237/0453
See application file for complete search history.

(56) References Cited

U.S. PATENT DOCUMENTS

| | | |
|---|---|---|
| 7,847,249 B2 | 12/2010 | Takahashi et al. |
| 8,124,934 B2 | 2/2012 | Maeda |
| 8,912,491 B2 | 12/2014 | Schoenmakers et al. |
| 10,923,318 B2 | 2/2021 | Gledhill et al. |
| 11,151,356 B2 | 10/2021 | Flanagan et al. |
| 2009/0084953 A1 | 4/2009 | Harada et al. |

(Continued)

FOREIGN PATENT DOCUMENTS

| | | |
|---|---|---|
| EP | 2058835 A1 | 5/2009 |
| JP | H10 312767 A | 11/1998 |
| JP | 2018181629 A * | 11/2018 |

OTHER PUBLICATIONS

Partial European Search Report issued for European Patent Application No. 23154039.4-1212 on Jun. 14, 2023, 31 pages.

(Continued)

*Primary Examiner* — David E Smith
*Assistant Examiner* — Hsien C Tsai
(74) *Attorney, Agent, or Firm* — Klarquist Sparkman, LLP

(57) ABSTRACT

Various approaches are provided for automatically focusing particle beams for SPA. In one example, a method includes determining a focus adjustment for a region of a sample to achieve a targeted defocus based on at least one defocus measurement from at least one neighboring region of the sample, and causing an acquisition of an image of the sample at the region with the focus adjustment. In this way, a targeted defocus may be achieved across regions of a sample with reduced auxiliary imaging, thereby providing increased and uniform image quality while reducing the time and thus increasing the throughput of processing.

19 Claims, 6 Drawing Sheets

(56) References Cited

U.S. PATENT DOCUMENTS

| | | |
|---|---|---|
| 2012/0194729 A1 | 8/2012 | Zahniser |
| 2020/0118788 A1 | 4/2020 | Sluijterman et al. |
| 2020/0272805 A1 | 8/2020 | Flanagan et al. |
| 2020/0286707 A1* | 9/2020 | Maassen ............... H01J 37/222 |
| 2021/0272767 A1 | 9/2021 | Bischoff et al. |

OTHER PUBLICATIONS

Extended European Search Report issued for European Patent Application No. 23154039.4-1212 / 4220683 on Nov. 15, 2023, 18 pages.

* cited by examiner

AUTOMATIC PARTICLE BEAM FOCUSING

FIELD

The present disclosure relates to charged particle beam systems in general, and to automatically focusing particle beams of charged particle beam systems in particular.

BACKGROUND

With recent improvements in electron optical design, electron detection, and image processing, atomic resolutions have been achieved. Single Particle Analysis (SPA) is a powerful technique that can benefit from such resolutions, for example, to determine the three-dimensional (3D) structures of macromolecules, such as proteins. With SPA, numerous images of identical structures are obtained at different orientations, thereby accumulating numerous image projections of the structures that can be used to obtain 3D knowledge of the structure. SPA can be performed using cryogenic electron microscopy (cryoEM). In cryoEM, macromolecule samples are arranged in an environmentally controlled microscope chamber and imaged at various positions and orientations with an electron beam. With SPA of proteins, an understanding of the 3D structure of proteins can be obtained and various protein functions can be discerned. This knowledge can then be leveraged to develop useful pharmaceutical drugs, for example.

SUMMARY

Various approaches are provided for automatically focusing particle beams. In one example, a method comprises determining a focus adjustment for a region of a sample to achieve a targeted defocus based on at least one defocus measurement from at least one neighboring region of the sample, and causing an acquisition of an image of the sample at the region with the focus adjustment. By adaptively focusing particle beams in this way, a targeted defocus may be achieved across regions of a sample with reduced auxiliary imaging, thereby providing increased and uniform image quality while reducing the time and thus increasing the throughput of processing.

The foregoing and other objects, features, and advantages of the present disclosure will become more apparent from the following detailed description, which proceeds with reference to the accompanying figures.

DETAILED DESCRIPTION

Figure 2:
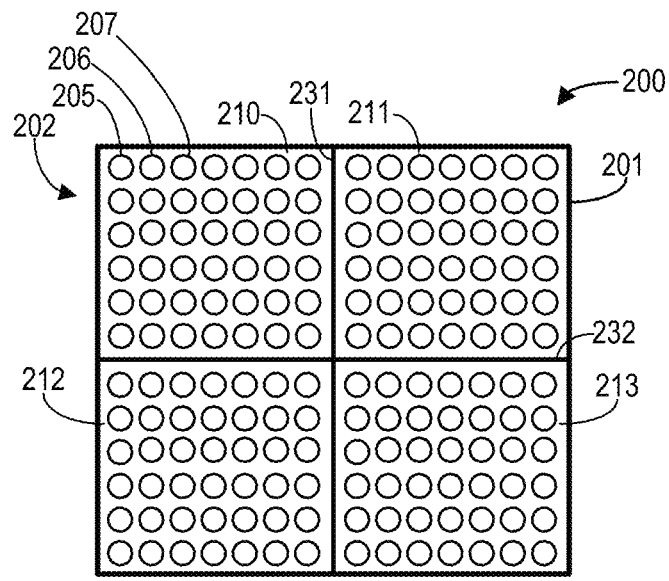
FIG. 2 shows a diagram illustrating an example sample with a foil overlay according to an example.
Figure 3:
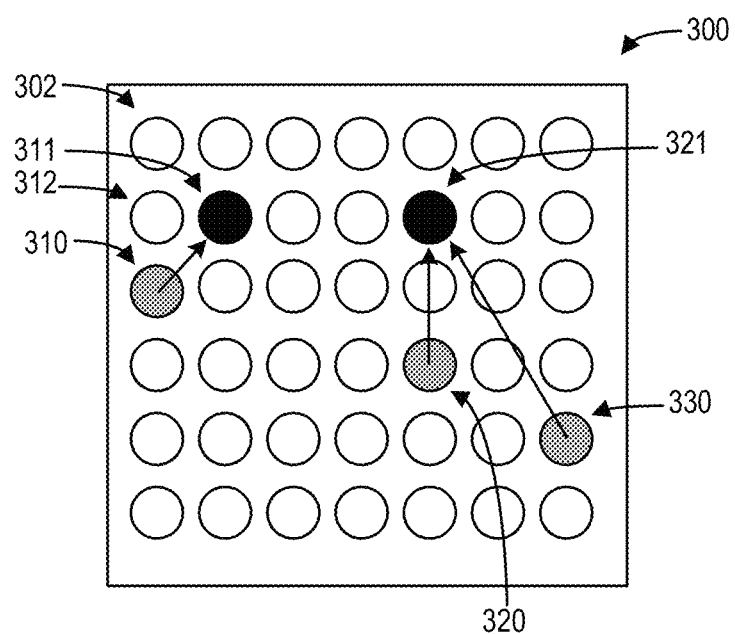
FIG. 3 shows a diagram illustrating example neighboring foil holes for determining focus settings according to an example.

The present disclosure relates to automatically focusing particle beams of charged particle beam systems. In particular, systems and methods are provided for applying a focus adjustment to a charged particle beam, such that the charged particle beam scattered by a sample will be focused on a detector to approximately achieve targeted defocus, based on defocus measurements from neighboring regions of the sample. Samples may be imaged and processed for single particle analysis (SPA) using a charged particle beam system, such as the charged particle beam system depicted in FIG. 1. In order to achieve high image quality, the charged particle beam of the charged particle beam system should be focused on the detector with targeted defocus to within at least 0.1 micrometer accuracy. More specifically, for cryoEM, rather than desiring a perfect "focus" on the detector, an amount of defocus (e.g., a shifting of the focus a few microns away from an in-focus condition as an illustrative example) balances the acquisition of high-resolution data with generating sufficient contrast within the image. Typically for an SPA session, a targeted defocus would be set prior to data acquisition to reach expected optical behavior and data quality. However, the actual defocus is affected by sample height, and SPA samples are typically plunge-frozen in liquid ethane which introduces variance in sample height across the sample. As a result, using a same optical focus while imaging across a sample may result in varying defoci due to the variance in sample height. The actual defocus may also be affected by other environmental factors such as temperature changes that cause focus drift. Further, determining how to focus the particle beam in order to achieve the targeted defocus involves various time-consuming steps to pinpoint the in-focus condition for the sample. For example, performing a preliminary image acquisition of the sample at a region of interest directly to measure the resulting defocus and thus estimate the sample height is undesirable because the interaction of the charged particle beam with the sample at the region of interest may damage the sample prior to the actual acquisition. To determine how to focus the particle beam to achieve the targeted defocus for a region of interest without directly imaging the region of interest, a conventional approach may include acquiring multiple auxiliary images under different optical conditions at locations close to a region of interest to determine focus settings for imaging the region of interest. However, acquiring such auxiliary images significantly decreases the SPA throughput because the sample may be repositioned for each auxiliary image. Further, a sample may include a large plurality of foil holes, as depicted in FIG. 2, wherein each foil hole is imaged during an SPA session, and so the conventional approach significantly increases the amount of time of an SPA session if the sample height and thus desired defocus is obtained for each foil hole. To reduce the number of images acquired during an SPA session and thus reduce the timing, while also achieving a high image quality by using accurate focus settings that result in the targeted defocus, a defocus for each foil hole may be estimated based on defocus measurements from neighboring foil holes, as depicted in FIG. 3. A method for automatically focusing a particle beam on a detector to approximately achieve targeted defocus, such as the method depicted in FIG. 4, may therefore include using auxiliary images to estimate the defocus and set the optical focus settings for an initial foil hole, and estimating defocus for remaining foil holes to adaptively adjust the optical focus throughout the SPA session. Another method for automatically focusing a particle beam, such as the method depicted in FIG. 5, may include using a default focus setting for an initial foil hole, measuring the defocus resulting from the default focus setting, and estimating defocus for remaining foil holes to adaptively adjust the optical focus throughout the SPA session. As the actual defocus is measured for each foil hole after the SPA acquisition at the foil hole, an error between the actual defocus and the targeted focus may be used to adapt optical focus settings so that the actual defoci converge to the targeted defocus, thus enabling a consistent high image quality for acquisitions while also increasing the overall SPA throughput.

Figure 1:
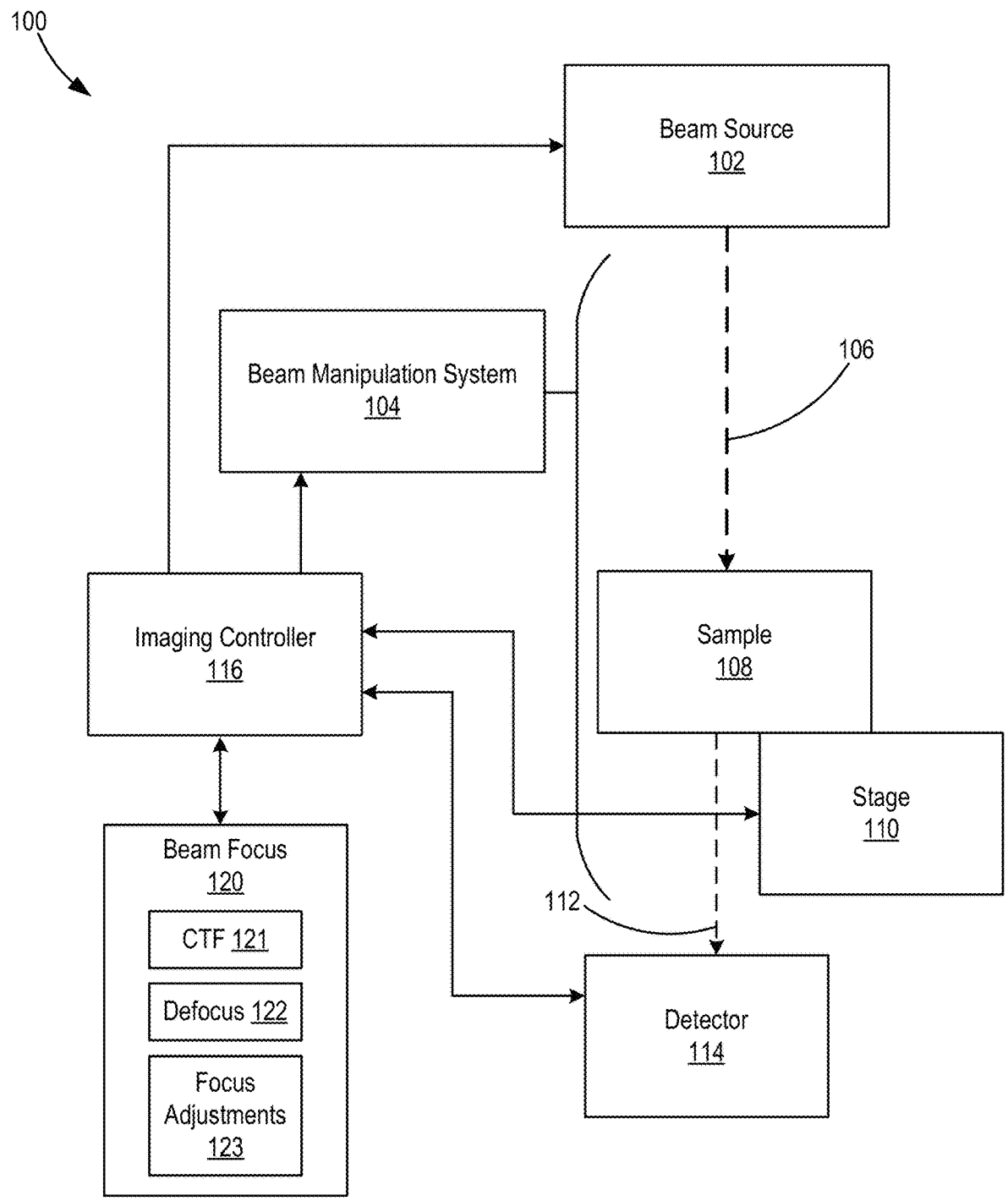
FIG. 1 shows a block diagram illustrating an example charged particle microscope system according to an example.

Turning now to the figures, with reference to FIG. 1, a charged particle microscope 100 uses a beam source 102 and a charged particle beam manipulation system 104 (such as one or more charged particle lenses) to direct a particle beam 106 to a sample 108 of interest and to direct output particles 112 to a detector 114. The charged particles of the particle beam 106 may comprise electrons, as an illustrative and non-limiting example, and the charged particle microscope 100 may be configured for transmission electron microscopy (TEM), scanning electron microscopy (SEM), scanning transmission electron microscopy (STEM), ion beam microscopy (IBM), and so on. The sample 108 is movably supported by a movement stage 110, often in a controlled environment such as a cryogenically controlled vacuum chamber. In various examples, the movement stage 110 can translate and/or rotate the sample 108 in various directions to image different positions and/or orientations of the sample 108. The particle beam 106 interacts with the sample 108 and output particles 112 are received by a detector 114, such as an imaging sensor, to form an image. An imaging controller 116 can be coupled to different components of the charged particle microscope 100, such as the beam source 102, beam manipulation system 104, movement stage 110, and/or detector 114 to control timing and collection of the images produced with the output particles 112.

The imaging controller 116 can also include or be coupled to a beam focus tool 120 configured to determine a focus setting for focusing the particle beam 106 on the sample 108 after the movement stage 110 moves the sample 108 to a selected position. For example, the beam focus tool 120 is configured to measure a defocus 122 for a region of interest based on an acquired image of the region of interest. Specifically, the beam focus tool 120 may estimate a contrast transfer function (CTF) 121 for the acquired image of the region of interest, and measure the actual defocus 122 from the estimated CTF 121 for the acquired image because the defocus 122 contributes to the dominant term in the CTF 121. If an image of the region of interest is not yet acquired, the beam focus tool 120 is configured to determine an optical focus, or more specifically to determine focus adjustments 123 to the optical focus of the particle beam 106 and the output particles 112, to achieve the targeted defocus for the region of interest based on measurements of defocus 122 from surrounding regions of interest. Such regions of interest may correspond to neighboring regions of a sample, which may comprise foil holes as an illustrative and non-limiting example described further herein, or alternatively may correspond to auxiliary regions within a foil hole and adjacent to the region of interest. The beam focus tool 120 provides the focus adjustments 123 to the imaging controller 116, which in turn controls the particle beam 106 via the beam manipulation system 104 according to the focus adjustments 123 when acquiring an image of the sample 108 at the region of interest. That is, the imaging controller 116 controls the optical focus or physical focus of the particle beam 106 via the beam manipulation system 104 to acquire an image via the detector 114 to achieve a targeted defocus, where the targeted defocus comprises a desired defocus for imaging the region of interest.

In this way, the beam focus tool 120 reduces an amount of time for imaging a sample at a plurality of regions of interest. For example, for single particle analysis (SPA), the sample 108 may be imaged at a plurality of regions of interest. For SPA, the sample 108 is prepared with a grid comprising many circular holes or foil holes wherein the sample 108 is imaged at the foil holes. As an illustrative and non-limiting example, FIG. 2 shows a diagram illustrating an example sample 200 prepared with a foil overlay 201, where the sample 200 may comprise the sample 108 as described hereinabove. The foil overlay 201 comprises a foil perforated with a plurality of foil holes 202, including a first foil hole 205, a second foil hole 206, a third foil hole 207, and so on as depicted. The foil overlay 201 may be divided into a plurality of grid squares, such as a first grid square 210, a second grid square 211, a third grid square 212, a fourth grid square 213, and so on. For example, the grid squares may be separated by copper bars 231 and 232, as an illustrative and non-limiting example. It should be appreciated that the number of foil holes and grid squares are illustrative and non-limiting. Further, it should be appreciated that the layout of the grid squares 210, 211, 212, and 213, as well as the distribution of hole diameters and pitches are illustrative and non-limiting. For example, the foil holes 202 may be arranged as grids in shapes other than a square, and the diameters and pitches of the foil holes 202 may vary among the grid squares or even within a grid square.

As an illustrative and non-limiting example, each foil hole of the plurality of foil holes 202 may be 2 μm in diameter, and the foil holes are distributed at a pitch of 5 though it should be appreciated that the plurality of foil holes 202 may be formed with different diameters and pitches as desired. The movement stage 110 moves the sample 200 to align the center of a given foil hole, such as the foil hole 205, with the particle beam 106, and the sample 200 is imaged at the foil hole 205. Image beam shifting may be used to image the sample 200 at different positions, in addition to or as an alternative to moving the sample 200 via the movement stage 110 relative to the particle beam 106. For example, multiple images may be acquired using image beam shift at a given hole position. The movement stage 110 then moves to the next hole (such as foil hole 206, which is 5 away as an example) and the procedure is repeated. This process may be repeated thousands of times, thus generating many thousands of images. From these images, the particles are picked, classified, aligned, and averaged to come to a certain resolution in the reconstructed particle. An SPA acquisition session can typically take several days. By reducing or eliminating the acquisition of auxiliary images for determining focus adjustments to achieve a targeted defocus, the time for an SPA acquisition session performed in accordance with the methods provided herein may be substantially reduced while achieving improved and consistent image quality.

Further, in order to achieve high image quality, the particle beam 106 should be focused to at least micrometer accuracy to achieve the targeted defocus. However, the sample height may vary across the plurality of foil holes 202, and so the defocus will similarly vary across the plurality of foil holes 202. Thus, using a same focus of a particle beam across foil holes will result in varying defocus. To achieve high image quality, focus settings for imaging a given foil hole of the plurality of foil holes 202 should be determined and adjusted prior to imaging the given foil hole in order to achieve the targeted defocus. To account for the sample height at a given foil hole, defocus for the given foil hole may be estimated based on the defocus for neighboring foil holes, and the focusing of the particle beam 106 may be adjusted to bring the estimated defocus to the targeted defocus. As an illustrative example, FIG. 3 shows a diagram illustrating an example grid square 300 for a sample, such as the sample 200 described hereinabove. Specifically, FIG. 3 illustrates example neighboring foil holes for determining focus settings of a given foil hole. The grid square 300 may comprise one of the grid squares 210, 211, 212, or 213 of the sample 200, for example. The grid square 300 comprises a plurality of foil holes 302. To determine a defocus value for the foil hole 310, for example, neighboring foil holes with a defocus measurement (e.g., the black foil holes as depicted) such as the foil hole 311 may be used to determine the defocus value for the foil hole 310 because the foil hole 311 is adjacent to the foil hole 310. Meanwhile, neighboring foil holes without any defocus measurement (e.g., the white foil holes as depicted) such as the foil hole 312 are disregarded when determining the defocus value for the foil hole 310. The known defocus for the foil hole 311 may be assigned as the defocus for the foil hole 310, for example, where the known defocus or reference defocus for the foil hole 311 is obtained via a CTF estimated for an image acquired for the foil hole 311.

The determined defocus value for the foil hole 310 is used to generate focus adjustment(s) for imaging the foil hole 310. Specifically, the focus adjustment(s) are generated based on a difference between the determined defocus value and the targeted defocus. For example, as sample height affects defocus, variations in sample height at the neighboring foil holes may result in corresponding deviations in measured defocus from the targeted defocus at the neighboring foil holes. By adjusting the optical focus of the particle beam for imaging the foil hole 310 to account for the difference between the determined defocus value for the foil hole 310 and the targeted defocus, the actual defocus achieved when imaging the foil hole 310 with the focus adjustments may be closer to the targeted defocus. After imaging the foil hole 310 and subsequently measuring the actual defocus achieved for the foil hole 310 with the focus adjustments, the known defocus values for the foil holes 310 and 311 may be used as reference defoci to determine focus adjustments for imaging the foil hole 312 because the foil hole 312 is adjacent to the foil holes 310 and 311. In this way, the deviation of the measured defocus for the foil hole 310 from the targeted defocus as well as the deviation of the measured defocus for the foil hole 311 from the targeted defocus may be used to obtain focus adjustments for imaging the foil hole 312 that may result in the actual defocus from imaging the foil hole 312 being closer to the targeted defocus.

Further, for foil holes such as the foil hole 320 and the foil hole 330 that do not have immediately-adjacent foil holes with defocus measurements, as depicted, a defocus value for both foil holes 320 and 330 may be determined based on a foil hole within the neighborhood of the foil holes that does include a defocus measurement, such as the foil hole 321. A threshold distance may be determined to establish a neighborhood for each foil hole, wherein foil holes with defocus measurements within the neighborhood are considered when determining the defocus for a given foil hole. If no area with a defocus measurement falls within the threshold distance, auxiliary images may be acquired to estimate defocus. In this way, the defocus value for the foil hole 311 may not be used to determine the defocus values for the foil holes 320 and 330 if the foil hole 311 is outside the threshold distance from the foil holes 320 and 330. Further, although there may be foil holes in a neighboring grid square, the methods provided herein for estimating defocus for a given foil hole may limit consideration of neighboring measurements to a same grid square. In other words, the estimation of a defocus value for a given foil hole in the grid square 300 may be based on defocus measurements from foil holes within the grid square 300 but not on measurements from foil holes within grid squares adjacent to the grid square 300.

Further, as mentioned hereinabove, if sample height variation is the dominant source of defocus variation, estimating defocus values across regions of the sample corresponds to constructing a height map. Predicting the height value at a location where no measurement exists therefore amounts to extrapolating such a height map. Some approaches to such extrapolation include nearest-neighbor extrapolation (e.g., using a closest known value or values) and weighted averaging of all known values. Weights may be calculated, as illustrative and non-limiting examples, based on the distance to the extrapolation point (e.g., inverse distance weighting), credibility scores (e.g., a measure of the quality of measurement), or a combination thereof. Other approaches may include constructing an explicit model of a height map $h(x, y)$ that assigns a height value to each location $(x, y)$. Such a model includes parameters that are fit to the measured data each time a new measurement is made, thereby gradually refining and extending the model. The model may be updated deterministically, for example based on the weighted sum of radial basis functions. As another example, a stochastic model (e.g., a Gaussian process) may be used for approximation and prediction. Thus, while estimating defocus values are described herein for use in determining focus adjustments, it should be appreciated that the systems and methods described herein may instead be implemented with estimates of sample height that are in turn used to determine focus adjustments.

It should be appreciated that, although SPA and samples prepared with foil holes are described herein, the systems and methods provided herein may be applied to other imaging protocols, and to imaging samples without foil holes. For example, rather than estimating defocus from other foil holes of a sample to determine focus adjustments, defocus for a region may be estimated from other regions of a sample without foil holes to determine focus adjustments.

Figure 4:
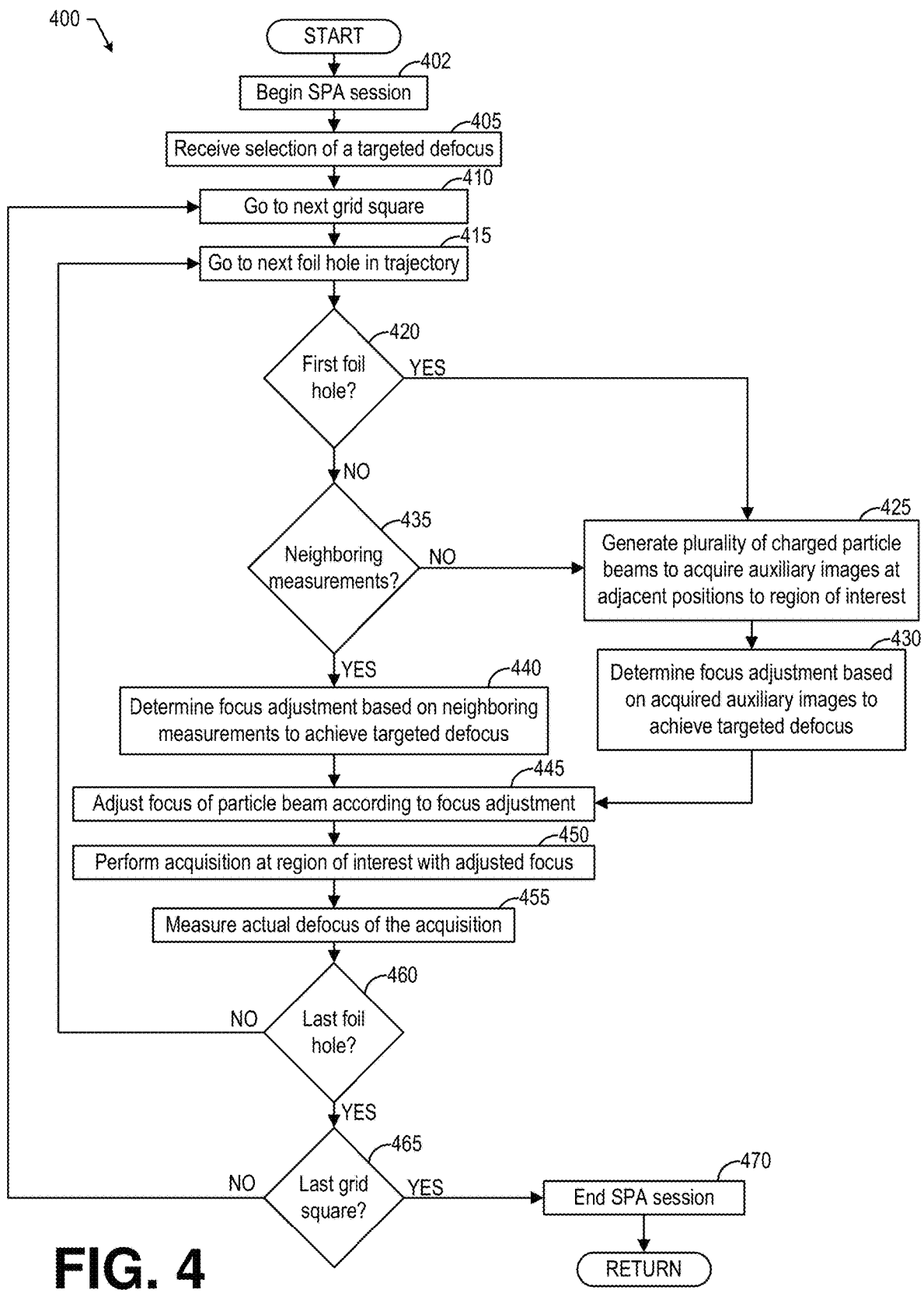
FIG. 4 shows a high-level flow chart illustrating an example method for automatically focusing a particle beam according to an example.

To further illustrate the adaptive focusing of particle beams to achieve a targeted defocus for a given foil hole, FIG. 4 shows a high-level flow chart illustrating an example method 400 for automatically focusing a particle beam 106 on a sample 108 to obtain an image with a targeted defocus. In particular, method 400 relates to estimating a defocus parameter for a given region based on neighboring defocus measurements and adjusting the physical or optical focus of a particle beam for imaging the given region accordingly such that the actual defocus for an acquired image of the given region is adapted towards the targeted defocus. In this way, particle beams may be automatically focused to account for variations in sample height across a sample while achieving the targeted defocus. Method 400 is described with regard to the systems and components of FIGS. 1-3, though it should be appreciated that the method 400 may be implemented with other systems and components without departing from the scope of the present disclosure. Method 400 may be implemented as executable instructions in non-transitory memory of the imaging controller 116 and/or the beam focus tool 120 which may be executed by the imaging controller 116 and/or the beam focus tool 120 to perform the actions described herein.

Method 400 begins at 402. At 402, method 400 begins an SPA session for processing a sample prepared with a foil overlay perforated with a plurality of foil holes, where the foil holes are divided into a plurality of grid squares. It should be appreciated that while method 400 is described with regard to SPA, method 400 may be implemented with other imaging approaches wherein a sample or samples is imaged at different locations or regions without the use of a foil overlay.

At 405, method 400 receives a selection of a targeted defocus for the SPA session. Method 400 may receive the selection of the targeted defocus from a user via user input, as an illustrative and non-limiting example. Alternatively, method 400 may receive an automatic selection of the targeted defocus wherein the targeted defocus is automatically selected according to one or more of imaging parameters, the type of sample being imaged, desired image quality, and so on. The targeted defocus comprises a desired defocus for each image acquired during the SPA session. It should be appreciated that while method 400 is described with regard to a single targeted defocus, in some examples, a plurality of targeted defoci may be selected wherein different targeted defoci may be assigned to different foil holes, different grid squares, and so on, for example based on the type of sample, variations in foil hole diameter or pitch, different imaging priorities, and so on, as illustrative and non-limiting examples.

At 410, method 400 goes to a next grid square. At the beginning of the SPA session, method 400 may initialize the SPA session with a first grid square of a plurality of grid squares of the sample. For example, method 400 may initialize the SPA session with the first grid square 210 of the sample 200, or another grid square of the sample 200. As processing of each grid square is complete, method 400 may continue to a next grid square of the plurality of grid squares. For example, after imaging each foil hole of the grid square 210, method 400 may proceed to processing the foil holes of another grid square, such as the grid square 211, and so on.

Further, at 415, method 400 goes to a next foil hole in a trajectory. For example, the trajectory may comprise a sequence of foil holes in the grid square for processing or imaging. Initially, method 400 begins at a first foil hole of the trajectory and iterates to a next foil hole of the trajectory during the SPA session until all foil holes in the trajectory are processed or imaged. Method 400 may therefore control the movement stage 110 to position the sample 108 such that the current foil hole of the current grid square is aligned with a path of the particle beam 106. Additionally or alternatively, method 400 may control the beam source 102 and the beam manipulation system 104 to direct the particle beam 106 to the current foil hole.

At 420, method 400 determines whether the current foil hole in the trajectory is the first foil hole of the current grid square. If the current foil hole is the first foil hole ("YES"), method 400 continues to 425. At 425, method 400 generates a plurality of charged particle beams to acquire auxiliary images at adjacent positions to the region of interest of the foil hole, wherein the region of interest of the foil comprises a region within the foil hole to be imaged according to SPA. The plurality of charged particle beams may be generated with different optical conditions, for example by varying lens powers via the beam manipulation system 104 to establish different focus settings as an illustrative and non-limiting example, so that the auxiliary images are acquired under varying conditions. At 430, method 400 determines a focus adjustment for the region of interest based on the acquired auxiliary images in order to achieve the targeted defocus. For example, method 400 may estimate a contrast transfer function (CTF) for each auxiliary image, determine defocus from the estimated CTF for each auxiliary image where the defocus contributes to the dominant term in the CTF, and estimate the defocus for the region of interest based on the defoci of adjacent positions determined from the auxiliary images. In other words, as the defoci of adjacent positions may vary as a result of varying sample height at the adjacent positions, the estimated defocus for the region of interest comprises an estimate of sample height at the region of interest. In order to achieve the targeted defocus during imaging of the region of interest, method 400 determines one or more focus adjustments for imaging the region of interest, for example by calculating the difference between the estimated defocus of the region of interest and the targeted defocus. For example, if the estimated defocus is greater than the targeted defocus or less than the targeted defocus, the focus adjustments account for such differences so that the actual defocus achieved when imaging the region of interest may correspond to the targeted defocus. After determining the focus adjustment based on the acquired auxiliary images, method 400 continues to 445.

Referring again to 420, if the current foil hole is not the first foil hole ("NO"), method 400 instead continues to 435. At 435, method 400 determines whether there are neighboring defocus measurements in the current grid square. For example, method 400 may determine whether there are defocus measurements in neighboring foil holes within a threshold distance from the current foil hole. For example, the threshold distance may be selected such that neighboring measurements from foil holes within a surrounding area of the foil hole within the grid square are considered neighboring measurements, thereby excluding measurements from foil holes within the grid square but outside the threshold distance. The threshold distance may therefore define a neighborhood of the current foil hole. As another example, method 400 may determine whether there are defocus measurements in any foil holes of the current grid square. As yet another example, method 400 may use a nearest-neighbor algorithm, such as a naïve $O(n^2)$ nearest-neighbor algorithm as an illustrative and non-limiting example, to identify neighboring defocus measurements.

If there are no defocus measurements in neighboring foil holes ("NO"), method 400 may continue to 425 to acquire auxiliary images and determine focus adjustments for the current foil hole based on the auxiliary images as described hereinabove. However, if there are defocus measurement(s) in neighboring foil holes ("YES"), method 400 continues to 440.

At 440, method 400 determines a focus adjustment for the current foil hole based on the neighboring measurements to achieve the targeted defocus. To determine the focus adjustment for the current foil hole based on the neighboring measurements, method 400 may estimate a defocus for the current foil hole based on the neighboring measurements. In one example, method 400 assigns the measured actual defocus from the closest foil hole with at least one CTF measurement to the current foil hole. If there is more than one CTF measurement for a neighboring foil hole (e.g., due to the acquisition of auxiliary images at the neighboring foil hole or multiple acquisitions for multiple regions of interest in the neighboring foil hole), method 400 may calculate a single defocus measurement based on the multiple CTF measurements for the neighboring foil hole and use the single defocus measurement as the neighboring measurement. As an illustrative and non-limiting example, method 400 may calculate an aggregated value, such as an arithmetic mean as one example, of the multiple defocus measurements corresponding to the multiple CTF measurements for the neighboring foil hole and use the aggregated value as the neighboring measurement. If there is more than one neighboring foil hole with at least one CTF measurement, method 400 may calculate an aggregated value, such as an average or arithmetic mean, of the aggregated value for each neighboring foil hole. Additionally or alternatively, method 400 may calculate a weighted average of the aggregated defocus value for each neighboring foil hole, with weights for each defocus assigned based on distance of the neighboring foil hole to the current foil hole, as one example. As other examples, the weights for each defocus may be assigned based on the distance to the foil hole, credibility scores for the defocus measurements from the foil holes, and combinations thereof. As an example, credibility scores may be calculated to quantify the quality of defocus measurements, for example, based on the error between the measured defocus and the targeted defocus at the foil hole, wherein a larger error may correspond to a lower credibility score and thus a lower weight for the defocus measurement, while a smaller error may correspond to a higher credibility score and thus a higher weight for the defocus measurement. As yet another example, credibility scores may be based on estimations of image quality of the acquired image at the foil holes. It should be appreciated that any suitable model for calculating or predicting a defocus for the current foil hole based on neighboring defocus measurements may be used, such as inverse distance weighting, regression models, neural network models, and so on, as illustrative and non-limiting examples. In general, method 400 estimates the defocus for the current foil hole based on neighboring defocus measurements. Further, method 400 may estimate the defocus based on parameters other than distance of other defocus measurements or in addition to the distance of other defocus measurements. For example, vertical stage drift of the movement stage 110 during acquisition may cause a measurable defocus offset that method 400 may account for during defocus estimation. As another example, specimen tilt or the tilting of the sample may cause the sample height to change in a predictable way perpendicular to the tilt axis, and so method 400 may adjust defocus estimation based on specimen tilt. As yet another example, temperature changes in the microscope environment may affect lengths and distances in the optical elements of the beam manipulation system 104, for example, which may result in corresponding changes in the electromagnetic fields that may manifest as a change in defocus or other optical parameters. Thus, if the room temperature is not stable, a drift of optical parameters may occur. Method 400 may therefore take environmental factors such as temperature changes into account during defocus estimation. In general, method 400 may estimate defocus based on other defocus measurements, and may adapt the defocus estimate based on one or more factors impacting focus drift such as vertical stage drift, specimen tilt, temperature variation, and so on to obtain a more accurate defocus estimate.

After estimating the defocus, to achieve the targeted defocus during imaging of the current foil hole, method 400 determines one or more focus adjustments for physically adjusting the optical focus of the particle beam based on the estimated defocus and the targeted defocus. For example, the one or more focus adjustments may account for a difference between the estimated defocus and the targeted defocus, such that the actual defocus of an image of the current foil hole acquired via a particle beam physically focused with the one or more focus adjustments is equal to the targeted defocus or is at least closer to the targeted defocus than the estimated defocus. The focus adjustment may additionally or alternatively comprise adjustments to the position of the sample via adjustments to the position of the movement stage 110, for example, that would cause the actual defocus to converge to the targeted defocus. After determining the focus adjustment based on neighboring measurements at 440, method 400 continues to 445.

Thus, once the focus adjustment is determined at 440 based on measurements from neighboring foil holes or at 430 based on auxiliary images acquired within the foil hole, method 400 continues to 445. At 445, method 400 adjusts the focus of the particle beam according to the focus adjustment, for example by controlling the beam manipulation system 104. Additionally or alternatively, method 400 may move the sample, for example by controlling the movement stage 110 to adjust the position of the sample relative to the particle beam and thus adjust the particle beam focus at the detector according to the focus adjustment. The focus adjustment may therefore include one or more of adjustments to focus settings via the beam manipulation system 104 and adjustments to sample positions via the movement stage 110. At 450, method 400 performs an acquisition at the region of interest with the adjusted focus. To that end, method 400 controls the beam source 102, the beam manipulation system 104, and the detector 114 to image the sample 108 at the region of interest with the adjusted focus. For example, method 400 controls the beam source 102 to generate a particle beam 106 and may further control the beam manipulation system 104 to physically focus the particle beam 106 and the output particles 112 according to the adjusted focus such that the detector 114 acquires an image with the targeted defocus. Then, at 455, method 400 measures an actual defocus for the region of interest based on the image acquired at 445. For example, method 400 may estimate a CTF for the region of interest based on the acquired image to measure the actual defocus. Method 400 may store the actual defocus in memory as the defocus measurement for the region of interest of the current foil hole. Further, method 400 may determine a difference or an error between the actual defocus and the target defocus and may store such difference in memory for subsequent reference.

Continuing at 460, method 400 determines whether the current foil hole is the last foil hole in the trajectory of the grid square. If the current foil hole is not the last foil hole ("NO"), method 400 returns to 415 to proceed to the next foil hole in the trajectory. Method 400 thus iterates through each foil hole in the trajectory of a grid square to acquire an image of the region of interest, automatically and adaptively focusing the particle beam to achieve the targeted defocus until all foil holes of the trajectory through the grid square are processed. Once the current foil hole is the last foil hole ("YES") at 460, method 400 continues to 465. At 465, method 400 determines whether the current grid square is the last grid square of the sample. If the current grid square is not the last grid square ("NO"), method 400 returns to 410 to proceed to the next grid square of the sample. Method 400 thus iterates through each grid square of the sample until all grid squares are thus processed. Once the current grid square is the last grid square ("YES") at 465, method 400 continues to 470. At 470, method 400 ends the SPA session. Method 400 then returns.

As depicted, method 400 may estimate defoci based on neighboring measurements and determine one or more focus adjustments at 440 immediately prior to adjusting the focus at 445 and performing the acquisition at the region of interest at 450. However, it should be appreciated that in some examples, predictions of the defocus and/or adjustments to focus for each remaining foil hole in a grid square may be updated responsive to the determination of an actual defocus and/or an error between the actual defocus and the targeted defocus for a given foil hole at 455. For example, once an actual defocus and/or defocus error is stored for a given foil hole, a prediction of the defocus and/or a determination of focus adjustments for each remaining foil hole in the grid square may be updated based on the latest defocus measurement and/or defocus error. In this way, the throughput of SPA acquisitions may be improved because the estimation of defoci and/or focus adjustments based on neighboring measurements may be determined when method 400 goes to the next foil hole.

Thus, a method for automatic particle beam focusing includes automatically adjusting the particle beam focus for imaging a sample at a given foil hole based on measured defoci from images of the sample at neighboring foil holes, and controlling a charged particle beam system with the adjusted focus to acquire an image with the targeted defocus. In this way, the particle beam focus may be adapted for imaging a sample at a given foil hole with a targeted defocus without acquiring auxiliary images in the given foil hole, thereby increasing the throughput of SPA processing due to decreased imaging and without potentially altering the region of interest via the auxiliary acquisitions. Further, as the particle beam is adaptively focused to account for sample height variations, a targeted defocus may be achieved across a plurality of regions in a sample, thereby providing consistent imaging resolution and image quality despite non-flat sample surfaces.

Figure 5:
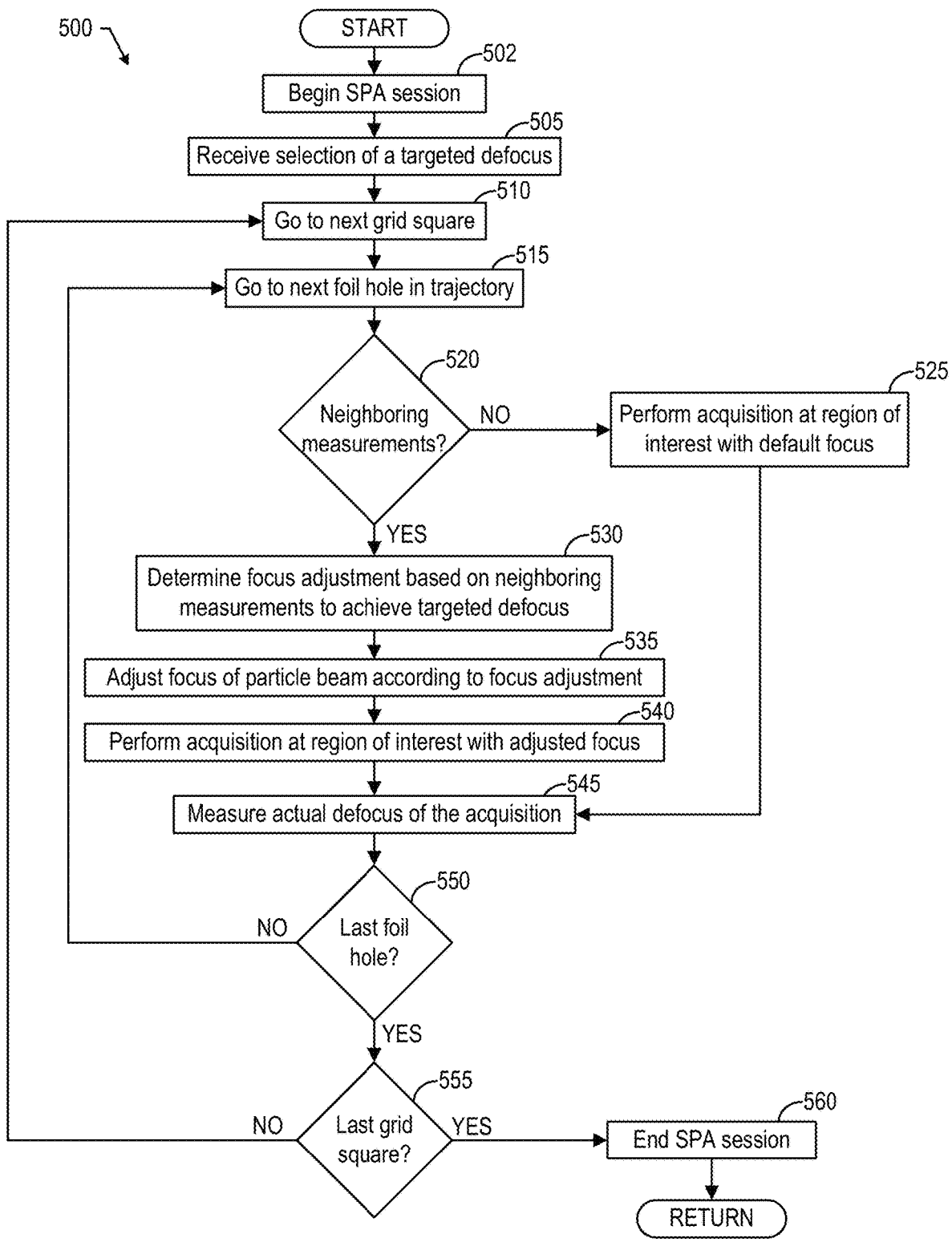
FIG. 5 shows a high-level flow chart illustrating another example method for automatically focusing a particle beam according to an example.

It should be appreciated that the method for automatic particle beam focusing provided herein may be accomplished without acquiring any auxiliary images. As an illustrative example, FIG. 5 shows a high-level flow chart illustrating another example method 500 for automatically focusing a particle beam on a sample without acquiring auxiliary images. In particular, method 500 relates to automatically and adaptively focusing a particle beam to achieve a targeted defocus without acquiring auxiliary images. Method 500 is described with regard to the systems and components of FIGS. 1-3, though it should be appreciated that the method 500 may be implemented with other systems and components without departing from the scope of the present disclosure. Method 500 may be implemented as executable instructions in non-transitory memory of the imaging controller 116 and/or the beam focus tool 120, and may be executed by the imaging controller 116 and/or the beam focus tool 120 to perform the actions described herein.

Method 500 begins at 502. At 502, method 500 begins an SPA session for processing a sample prepared with a foil overlay perforated with a plurality of foil holes, where the foil holes are divided into a plurality of grid squares. At 505, method 500 receives a selection of at least one targeted defocus. Method 500 may receive the selection of the targeted defocus from a user via user input, as an illustrative and non-limiting example. Alternatively, method 500 may receive an automatic selection of the targeted defocus wherein the targeted defocus is automatically selected according to one or more of imaging parameters, the type of sample being imaged, desired image quality, and so on. The targeted defocus comprises a desired defocus for each image acquired during the SPA session. It should be appreciated that while method 500 is described with regard to a single targeted defocus, in some examples, a plurality of targeted defoci may be selected wherein different targeted defoci may be assigned to different foil holes, different grid squares, and so on, for example based on the type of sample, variations in foil hole diameter or pitch, different imaging priorities, and so on, as illustrative and non-limiting examples.

Continuing at 510, method 500 goes to a next grid square of the sample. At the beginning of the SPA session, method 500 may initialize the SPA session with a first grid square of a plurality of grid squares of the sample. As processing of each grid square is complete, method 500 may continue to a next grid square of the plurality of grid squares.

Further, at 515, method 500 goes to a next foil hole in a trajectory. As described above, the trajectory may comprise a sequence of foil holes in the grid square for processing or imaging. Initially, method 500 begins at a first foil hole of the trajectory and iterates to a next foil hole of the trajectory during the SPA session until all foil holes in the trajectory are processed or imaged. Method 500 may therefore control the movement stage 110 to position the sample 108 such that the current foil hole of the current grid square is aligned with a path of the particle beam 106. Additionally or alternatively, method 400 may control the beam source 102 and the beam manipulation system 104 to direct the particle beam 106 to the current foil hole.

At 520, method 500 determines whether there are neighboring defocus measurements in the current grid square. For example, method 500 may determine whether there are defocus measurements in neighboring foil holes within a threshold distance from the current foil hole. For example, the threshold distance may be selected such that neighboring measurements from foil holes within a surrounding area of the foil hole within the grid square are considered neighboring measurements in a neighborhood, thereby excluding measurements from foil holes within the grid square but outside the threshold distance. As another example, method 500 may determine whether there are defocus measurements in any foil holes of the current grid square. As yet another example, method 500 may use a nearest-neighbor algorithm, such as a naïve $O(n^2)$ nearest-neighbor algorithm as an illustrative and non-limiting example, to identify neighboring defocus measurements.

If there are no defocus measurements in neighboring foil holes ("NO"), method 500 may continue to 525 to perform an acquisition at the region of interest of the current foil hole with a default focus. The default focus may be predetermined according to the targeted defocus, as an illustrative and non-limiting example, and/or according to other parameters such as the type of parameter or an estimated height of the sample. The default focus may thus be determined to achieve the targeted defocus assuming the estimated height of the sample, for example. Method 500 thus controls the beam source 102, the beam manipulation system 104, and the detector 114 to image the sample 108 at the region of interest with the default focus. After performing the acquisition with the default focus, method 500 proceeds to 545.

However, referring again to 520, if there are defocus measurement(s) in neighboring foil holes ("YES"), method 500 continues to 530. At 530, method 500 determines a focus adjustment for the current foil hole based on the neighboring measurements to achieve the targeted defocus. To determine the focus adjustment for the current foil hole based on the neighboring measurements, method 500 may estimate a defocus for the current foil hole based on the neighboring measurements. In one example, method 500 assigns the measured actual defocus from the closest foil hole with at least one CTF measurement to the current foil hole. If there is more than one CTF measurement for a neighboring foil hole (e.g., due to the acquisition of auxiliary images at the neighboring foil hole or multiple acquisitions for multiple regions of interest in the neighboring foil hole), method 500 may calculate a single aggregated defocus measurement based on the multiple CTF measurements for the neighboring foil hole and use the single defocus measurement as the neighboring measurement. As an illustrative and non-limiting example, method 500 may calculate the arithmetic mean of the multiple defocus measurements corresponding to the multiple CTF measurements for the neighboring foil hole and use the arithmetic mean as the neighboring measurement. If there is more than one neighboring foil hole with at least one CTF measurement, method 500 may calculate an average or arithmetic mean of the average defocus for each neighboring foil hole. Additionally or alternatively, method 500 may calculate a weighted average of the average defocus for each neighboring foil hole, with weights for each defocus assigned based on distance of the neighboring foil hole to the current foil hole. It should be appreciated that other models for calculating or predicting a defocus for the current foil hole based on neighboring defocus measurements may be used, such as inverse distance weighting, regression models, neural network models, and so on, as illustrative and non-limiting examples. In general, method 500 estimates the defocus for the current foil hole by extrapolating neighboring defocus measurements. Further, as discussed hereinabove, method 500 may estimate the defocus based on parameters other than distance of other defocus measurements or in addition to the distance of other defocus measurements. For example, vertical stage drift of the movement stage 110 during acquisition may cause a measurable defocus offset that method 500 may account for during defocus estimation. As another example, specimen tilt or the tilting of the sample may cause the sample height to change in a predictable way perpendicular to the tilt axis, and so method 500 may adjust defocus estimation based on specimen tilt. As yet another example, temperature changes in the microscope environment may affect lengths and distances in the optical elements of the beam manipulation system 104, for example, which may result in corresponding changes in the electromagnetic fields that may manifest as a change in defocus or other optical parameters. Thus, if the room temperature is not stable, a drift of optical parameters may occur. Method 500 may therefore take environmental factors such as temperature changes into account during defocus estimation. In general, method 500 may estimate defocus based on other defocus measurements, and may adapt the defocus estimate based on one or more factors impacting focus drift such as vertical stage drift, specimen tilt, temperature variation, and so on to obtain a more accurate defocus estimate.

Then, to achieve the targeted defocus during imaging of the current foil hole, method 500 determines one or more focus adjustments for physically adjusting the optical focus of the particle beam based on the estimated defocus and the targeted defocus. For example, the one or more focus adjustments may account for a difference between the estimated defocus and the targeted defocus, such that the actual defocus of an image of the current foil hole acquired via a particle beam physically focused with the one or more focus adjustments is equal to the targeted defocus or is at least closer to the targeted defocus than the estimated defocus. After determining the focus adjustment based on neighboring measurements at 530, method 500 continues to 535.

After determining the focus adjustment(s) based on neighboring measurements at 530, method 500 continues to 535. At 535, method 500 adjusts the focus of the particle beam according to the focus adjustment, for example by controlling the beam manipulation system 104. Additionally or alternatively, method 500 may move the sample, for example by controlling the movement stage 110 to adjust the position of the sample relative to the particle beam and thus adjust the particle beam focus at the detector according to the focus adjustment. The focus adjustment may therefore include one or more of adjustments to focus settings via the beam manipulation system 104 and adjustments to sample positions via the movement stage 110. At 540, method 500 performs an acquisition at the region of interest with the adjusted focus. To that end, method 500 controls the beam source 102, the beam manipulation system 104, and the detector 114 to image the sample 108 at the region of interest with the adjusted focus. For example, method 500 controls the beam source 102 to generate a particle beam 106 and may further control the beam manipulation system 104 to physically focus the particle beam 106 and the output particles 112 according to the adjusted focus such that the detector 114 acquires an image with the targeted defocus.

After performing the acquisition at the region of interest with the adjusted focus at 540 or the default focus at 525, method 500 continues to 545. At 545, method 500 measures an actual defocus for the region of interest based on the image acquired at 540 with the adjusted focus or based on the image acquired at 525 with the default focus. For example, method 500 may estimate a CTF for the region of interest based on the acquired image to determine the actual defocus. Method 500 may store the actual defocus as the defocus measurement for the region of interest of the current foil hole. In this way, the defocus measurement may be used to estimate a defocus and thus determine focus adjustments for a neighboring foil hole. Further, method 500 may determine a difference or an error between the actual defocus and the target defocus and may store such difference in memory for subsequent reference.

Continuing at 550, method 500 determines whether the current foil hole is the last foil hole in the trajectory of the grid square. If the current foil hole is not the last foil hole ("NO"), method 500 returns to 515 to proceed to the next foil hole in the trajectory. Method 500 thus iterates through each foil hole in the trajectory of a grid square to acquire an image of the region of interest, adjusting the particle beam focus to achieve the targeted defocus for each foil hole, until all foil holes of the trajectory through the grid square are processed. Once the current foil hole is the last foil hole ("YES") at 550, method 500 continues to 555. At 555, method 500 determines whether the current grid square is the last grid square of the sample. If the current grid square is not the last grid square ("NO"), method 500 returns to 510 to proceed to the next grid square of the sample. Method 500 thus iterates through each grid square of the sample until all grid squares are thus processed. Once the current grid square is the last grid square ("YES") at 555, method 500 continues to 560. At 560, method 500 ends the SPA session. Method 500 then returns.

Thus, a method for automatic particle beam focusing includes automatically adjusting the particle beam focus for imaging a sample at a given foil hole based on measured defoci from images of the sample at neighboring foil holes, and controlling a charged particle beam system with the adjusted focus to acquire an image with the targeted defocus. In this way, the particle beam focus may be adapted for imaging a sample at a given foil hole with a targeted defocus without acquiring any auxiliary images, thereby increasing the throughput of SPA processing due to decreased imaging and without potentially altering the region of interest via the auxiliary acquisitions. Further, as the particle beam is adaptively focused to account for sample height variations, a targeted defocus may be achieved across a plurality of regions in a sample, thereby providing consistent imaging resolution and image quality despite non-flat sample surfaces.

Figure 6:
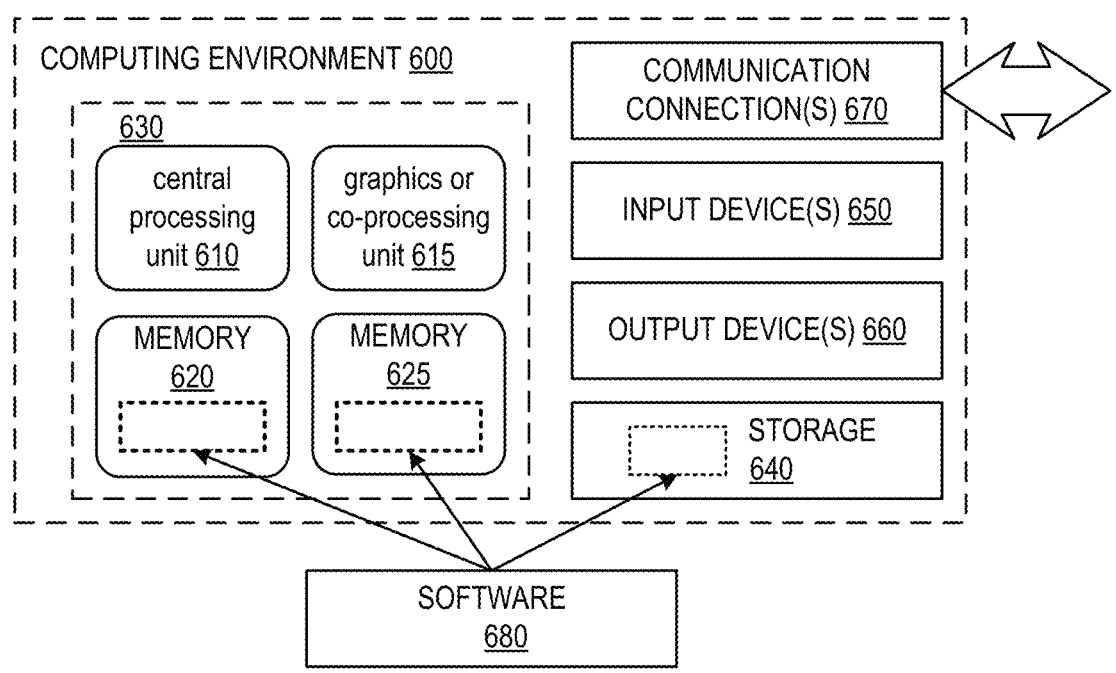
FIG. 6 shows a block diagram illustrating an example computing system in which some described examples can be implemented.

FIG. 6 depicts a generalized example of a suitable computing system 600 in which the described innovations may be implemented. The computing system 600 is not intended to suggest any limitation as to scope of use or functionality of the present disclosure, as the innovations may be implemented in diverse general-purpose or special-purpose computing systems.

With reference to FIG. 6, the computing system 600 includes one or more processing units 610, 615 and memory 620, 625. In FIG. 6, this basic configuration 630 is included within a dashed line. The processing units 610, 615 execute computer-executable instructions, such as for implementing components of the computing environments of, or providing the data (e.g., defocus measurements, etc.) outputs shown in, FIGS. 1, 4, and 5, described above. A processing unit can be a general-purpose central processing unit (CPU), processor in an application-specific integrated circuit (ASIC), or any other type of processor. In a multi-processing system, multiple processing units execute computer-executable instructions to increase processing power. For example, FIG. 6 shows a central processing unit 610 as well as a graphics processing unit or co-processing unit 615. The tangible memory 620, 625 may be volatile memory (e.g., registers, cache, RAM), non-volatile memory (e.g., ROM, EEPROM, flash memory, etc.), or some combination of the two, accessible by the processing unit(s) 610, 615. The memory 620, 625 stores software 680 implementing one or more innovations described herein, in the form of computer-executable instructions suitable for execution by the processing unit(s) 610, 615.

A computing system 600 may have additional features. For example, the computing system 600 includes storage 640, one or more input devices 650, one or more output devices 660, and one or more communication connections 670. An interconnection mechanism (not shown) such as a bus, controller, or network interconnects the components of the computing system 600. Typically, operating system software (not shown) provides an operating environment for other software executing in the computing system 600, and coordinates activities of the components of the computing system 600.

The tangible storage 640 may be removable or non-removable, and includes magnetic disks, magnetic tapes or cassettes, CD-ROMs, DVDs, or any other medium which can be used to store information in a non-transitory way and which can be accessed within the computing system 600. The storage 640 stores instructions for the software 680 implementing one or more innovations described herein.

The input device(s) 650 may be a touch input device such as a keyboard, mouse, pen, or trackball, a voice input device, a scanning device, or another device that provides input to the computing system 600. The output device(s) 660 may be a display, printer, speaker, CD-writer, or another device that provides output from the computing system 600.

The communication connection(s) 670 enable communication over a communication medium to another computing entity, such as between microscope control interfaces, particle beam focus tools, and cloud computing systems. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Figure 7:
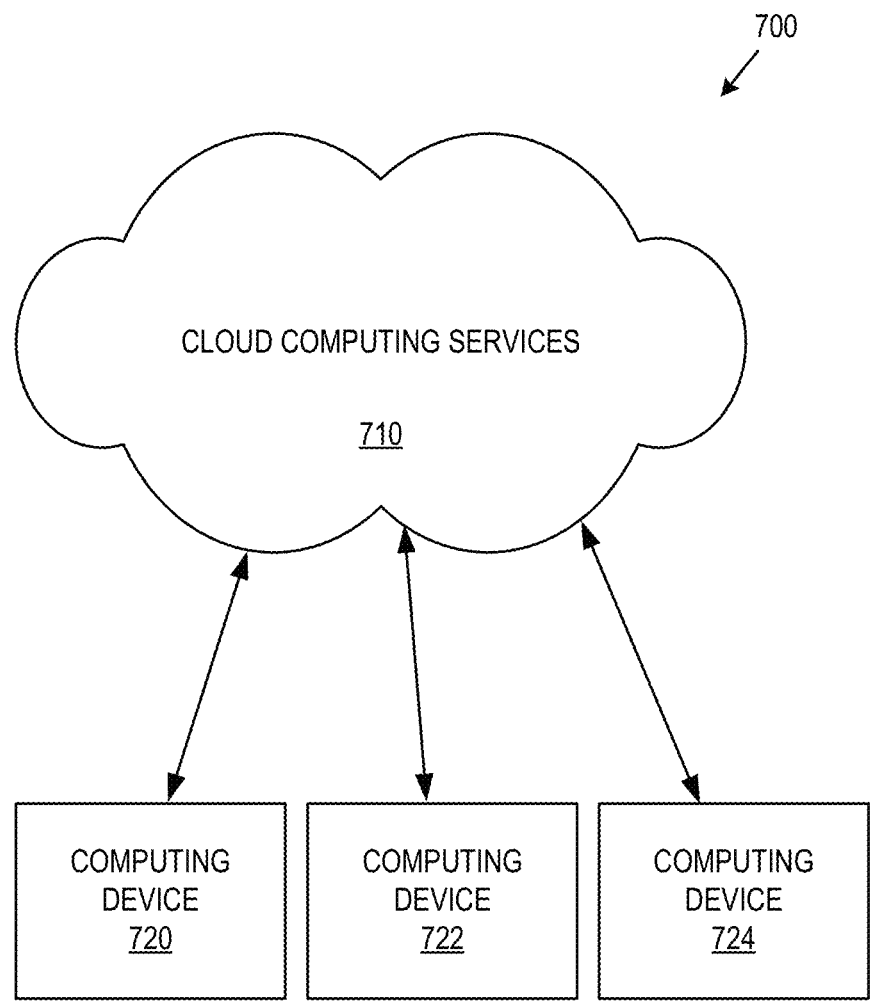
FIG. 7 shows a block diagram illustrating an example cloud computing environment that can be used in conjunction with the technologies described herein.

FIG. 7 depicts an example cloud computing environment 700 in which the described technologies can be implemented. The cloud computing environment 700 includes cloud computing services 710. The cloud computing services 710 can comprise various types of cloud computing resources, such as computer servers, data storage repositories, networking resources, etc. The cloud computing services 710 can be centrally located (e.g., provided by a data center of a business or organization) or distributed (e.g., provided by various computing resources located at different locations, such as different data centers and/or located in different cities or countries). The cloud computing services 710 are utilized by various types of computing devices (e.g., client computing devices), such as computing devices 720, 722, and 724. For example, the computing devices (e.g., 720, 722, and 724) can be computers (e.g., desktop or laptop computers), mobile devices (e.g., tablet computers or smart phones), or other types of computing devices. For example, the computing devices (e.g., 720, 722, and 724) can utilize the cloud computing services 710 to perform computing operations, e.g., data processing (such as CTF estimation, defocus prediction, etc.), data storage (such as model inputs and related data, defocus parameters, network training information, etc.), and the like.

Thus, various systems and methods are provided for automatically focusing particle beams. In one example, a method comprises determining a focus adjustment for a region of a sample to achieve a targeted defocus based on at least one defocus measurement from at least one other region of the sample, and causing an acquisition of an image of the sample at the region with the focus adjustment.

In a first example of the method, the method further comprises measuring an actual defocus for the region of the sample by analyzing the acquired image. In a second example of the method optionally including the first example, the method further comprises determining a second focus adjustment for a subsequent region of the sample based on the at least one defocus measurement from the at least one other region of the sample and the measured actual defocus for the region of the sample, and causing an acquisition of an image of the sample at the subsequent region with the second focus adjustment. In a third example of the method optionally including one or more of the first and second examples, the at least one defocus measurement from the at least one other region includes a plurality of defocus measurements from an associated plurality of other regions, and determining the focus adjustment for the region of the sample based on the at least one defocus measurement from the at least one other region comprises calculating an aggregate defocus value from the plurality of defocus measurements from the associated plurality of other regions, and determining the focus adjustment based on the aggregate defocus value. In a fourth example of the method optionally including one or more of the first through third examples, calculating the aggregate defocus value from the plurality of defocus measurements from the associated plurality of other regions further comprises weighting each defocus measurement of the plurality of defocus measurements from the associated plurality of other regions based at least on distances of each respective region of the associated plurality of other regions from the region. In a fifth example of the method optionally including one or more of the first through fourth examples, the method further comprises causing an acquisition of a plurality of auxiliary images of positions within an initial region of the sample, the positions adjacent to a region of interest of the initial region, determining an initial focus adjustment for the region of interest of the initial region based on the plurality of auxiliary images, causing an acquisition of an image of the region of interest of the initial region with the initial focus adjustment for the region of interest of the initial region, and measuring an actual defocus for the region of interest of the initial region from the acquired image of the region of interest, wherein the at least one defocus measurement from the at least one other region of the sample comprises the actual defocus for the region of interest of the initial region. In a sixth example of the method optionally including one or more of the first through fifth examples, causing an acquisition of the image of the sample at the region with the focus adjustment comprises controlling a beam source to generate a particle beam for directing toward the sample, controlling one or more of a beam manipulation system and a movement stage according to the focus adjustment, wherein controlling the beam manipulation system according to the focus adjustment comprises controlling the beam manipulation system to physically focus the particle beam according to the focus adjustment, and wherein controlling the movement stage according to the focus adjustment comprises controlling the movement stage to move the sample according to the focus adjustment, and controlling a detector to acquire the image of the sample at the region.

In another example, a system comprises an imaging system, and an imaging controller communicatively coupled to the imaging system, the imaging controller comprising a processor and a non-transitory memory configured with executable instructions that when executed cause the processor to generate a focus adjustment for a first region of a sample based on a targeted defocus and an estimated defocus measurement for a second region of the sample, the second region positioned away from the first region, and provide the focus adjustment to the imaging system for use in imaging the sample at the first region according to the focus adjustment.

In a first example of the system, the non-transitory memory is further configured with executable instructions that when executed cause the processor to estimate a contrast transfer function for an image of the sample at the first region, the image acquired via a particle beam focused according to the focus adjustment, and measure an actual defocus for the first region from the contrast transfer function. In a second example of the system optionally including the first example, the non-transitory memory is further configured with executable instructions that when executed cause the processor to generate a second focus adjustment for a subsequent region of the sample based on the estimated defocus measurement from the second region of the sample and the measured actual defocus for the first region of the sample, and provide the second focus adjustment to the imaging system for use in imaging the sample at the subsequent region according to the second focus adjustment. In a third example of the system optionally including one or more of the first and second examples, the first region and the second region respectively comprise a first foil hole and a second foil hole of the sample. In a fourth example of the system optionally including one or more of the first through third examples, to generate the focus adjustment for the first region of the sample based on the targeted defocus and the estimated defocus measurement for the second region of the sample, the non-transitory memory is further configured with executable instructions that when executed cause the processor to generate an aggregated defocus from a plurality of defocus measurements including the estimated defocus measurement, the plurality of defocus measurements determined from a corresponding plurality of regions of the sample including the second region, and generate the focus adjustment for the first region based on a difference between the aggregated defocus and the targeted defocus. In a fifth example of the system optionally including one or more of the first through fourth examples, to generate the aggregated defocus from the plurality of defocus measurements, the non-transitory memory is further configured with executable instructions that when executed cause the processor to weight each defocus measurement of the plurality of defocus measurements based on a distance of each corresponding region of the plurality of regions. In a sixth example of the system optionally including one or more of the first through fifth examples, the non-transitory memory is further configured with executable instructions that when executed cause the processor to control the imaging system to acquire a plurality of auxiliary images of positions within an initial region adjacent to a region of interest of the initial region, generate an initial focus adjustment for the region of interest of the initial region based on the plurality of auxiliary images, control the imaging system to acquire an image of the region of interest of the initial region via a particle beam focused with the initial focus adjustment, and estimate an initial actual defocus for the region of interest of the initial region from the acquired image, wherein the second region comprises the initial region and the estimated defocus measurement from the second region of the sample comprises the initial actual defocus.

In yet another example, a method comprises, during a single particle analysis session, determining a focus adjustment for an individual foil hole of a plurality of foil holes of a sample based on defocus measurements of other foil holes and a targeted defocus, and acquiring an image of the sample at the individual foil hole with a particle beam focused with the determined focus adjustment.

In a first example of the method, the method further comprises, for an initial foil hole of the plurality of foil holes, acquiring auxiliary images of the sample within the initial foil hole at positions adjacent to a region of interest of the initial foil hole, determining an initial focus adjustment for the region of interest of the initial foil hole based on the auxiliary images, acquiring an image of the region of interest of the initial foil hole via a particle beam focused with the initial focus adjustment, and measuring an actual defocus for the region of interest of the initial foil hole based on the acquired image of the region of interest, wherein the defocus measurements include the actual defocus. In a second example of the method optionally including the first example, the method further comprises, for an initial foil hole of the plurality of foil holes, acquiring an image of the sample at the initial foil hole with a default focus, and measuring an actual defocus for the initial foil hole from the acquired image of the sample at the initial foil hole, wherein the defocus measurements include the actual defocus for the initial foil hole. In a third example of the method optionally including one or more of the first and second examples, determining the focus adjustment for the individual foil hole of the plurality of foil holes of the sample based on the defocus measurements of the other foil holes and the targeted defocus comprises identifying, for the individual foil hole of the plurality of foil holes, foil holes of the plurality of foil holes within a neighborhood of the individual foil hole, calculating a defocus for the individual foil hole based on defocus measurements of the foil holes within the neighborhood, and determining the focus adjustment for the individual foil hole based on a difference between the calculated defocus and the targeted defocus. In a fourth example of the method optionally including one or more of the first through third examples, calculating the defocus for the individual foil hole comprises calculating a weighted average of the defocus measurements of the foil holes within the neighborhood. In a fifth example of the method optionally including one or more of the first through fourth examples, the plurality of foil holes is located in a grid square of the sample, and the method further comprises excluding foil holes within adjacent grid squares of the sample from the neighborhood.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

The innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing system. In general, a computing system or computing device can be local or distributed, and can include any combination of special-purpose hardware and/or general-purpose hardware with software implementing the functionality described herein.

In various examples described herein, a module (e.g., component or engine) can be "coded" to perform certain operations or provide certain functionality, indicating that computer-executable instructions for the module can be executed to perform such operations, cause such operations to be performed, or to otherwise provide such functionality. Although functionality described with respect to a software component, module, or engine can be carried out as a discrete software unit (e.g., program, function, class method), it need not be implemented as a discrete unit. That is, the functionality can be incorporated into a larger or more general-purpose program, such as one or more lines of code in a larger or general-purpose program.

For the sake of presentation, the detailed description uses terms like "determine" and "use" to describe computer operations in a computing system. These terms are high-level abstractions for operations performed by a computer, and should not be confused with acts performed by a human being. The actual computer operations corresponding to these terms vary depending on implementation.

Described algorithms may be, for example, embodied as software or firmware instructions carried out by a digital computer. For instance, any of the disclosed image processing, contrast transfer function estimation, defocus estimations, and/or automation techniques can be performed by one or more a computers or other computing hardware that is part of a microscopy tool. The computers can be computer systems comprising one or more processors (processing devices) and tangible, non-transitory computer-readable media (e.g., one or more optical media discs, volatile memory devices (such as DRAM or SRAM), or nonvolatile memory or storage devices (such as hard drives, NVRAM, and solid-state drives (e.g., Flash drives)). The one or more processors can execute computer-executable instructions stored on one or more of the tangible, non-transitory computer-readable media, and thereby perform any of the disclosed techniques. For instance, software for performing any of the disclosed embodiments can be stored on the one or more volatile, non-transitory computer-readable media as computer-executable instructions, which when executed by the one or more processors, cause the one or more processors to perform any of the disclosed techniques or subsets of techniques. The results of the computations can be stored in the one or more tangible, non-transitory computer-readable storage media and/or can also be output to the user, for example, by displaying, on a display device, defocus values, applied optical focus, and/or image data.

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use.

We claim:

1. A method, comprising:
   determining a focus adjustment for a region of a sample to achieve a targeted defocus based on at least one defocus measurement from at least one other region of the sample, wherein the region comprises a foil hole and the at least one other region comprises at least one other foil hole; and
   causing an acquisition of an image of the sample at the region with the focus adjustment.

2. The method of claim 1, further comprising measuring an actual defocus for the region of the sample by analyzing the acquired image.

3. The method of claim 2, further comprising:
   determining a second focus adjustment for a subsequent region of the sample based on the at least one defocus measurement from the at least one other region of the sample and the measured actual defocus for the region of the sample; and
   causing an acquisition of an image of the sample at the subsequent region with the second focus adjustment.

4. The method of claim 1, wherein the at least one defocus measurement from the at least one other region includes a plurality of defocus measurements from an associated plurality of other regions, and determining the focus adjustment for the region of the sample based on the at least one defocus measurement from the at least one other region comprises:
   calculating an aggregate defocus value from the plurality of defocus measurements from the associated plurality of other regions; and
   determining the focus adjustment based on the aggregate defocus value.

5. The method of claim 4, wherein calculating the aggregate defocus value from the plurality of defocus measurements from the associated plurality of other regions further comprises:
   weighting each defocus measurement of the plurality of defocus measurements from the associated plurality of other regions based at least on distances of each respective region of the associated plurality of other regions from the region.

6. The method of claim 1, further comprising:
   causing an acquisition of a plurality of auxiliary images of positions within an initial region of the sample, the positions adjacent to a region of interest of the initial region;
   determining an initial focus adjustment for the region of interest of the initial region based on the plurality of auxiliary images;
   causing an acquisition of an image of the region of interest of the initial region with the initial focus adjustment for the region of interest of the initial region; and
   measuring an actual defocus for the region of interest of the initial region from the acquired image of the region of interest, wherein the at least one defocus measurement from the at least one other region of the sample comprises the actual defocus for the region of interest of the initial region.

7. The method of claim 1, wherein causing an acquisition of the image of the sample at the region with the focus adjustment comprises:
   controlling a beam source to generate a particle beam for directing toward the sample;
   controlling one or more of a beam manipulation system and a movement stage according to the focus adjustment, wherein controlling the beam manipulation system according to the focus adjustment comprises controlling the beam manipulation system to physically focus the particle beam according to the focus adjustment, and wherein controlling the movement stage according to the focus adjustment comprises controlling the movement stage to move the sample according to the focus adjustment; and
   controlling a detector to acquire the image of the sample at the region.

8. A system, comprising:
   an imaging system; and
   an imaging controller communicatively coupled to the imaging system, the imaging controller comprising a processor and a non-transitory memory configured with executable instructions that when executed cause the processor to:
      generate a focus adjustment for a first region of a sample based on a targeted defocus and an estimated defocus measurement for a second region of the sample, the second region positioned away from the first region, wherein the first region and the second region respectively comprise a first foil hole and a second foil hole of the sample; and
      provide the focus adjustment to the imaging system for use in imaging the sample at the first region according to the focus adjustment.

9. The system of claim 8, wherein the non-transitory memory is further configured with executable instructions that when executed cause the processor to:
   estimate a contrast transfer function for an image of the sample at the first region, the image acquired via a particle beam focused according to the focus adjustment; and
   measure an actual defocus for the first region from the contrast transfer function.

10. The system of claim 9, wherein the non-transitory memory is further configured with executable instructions that when executed cause the processor to:
    generate a second focus adjustment for a subsequent region of the sample based on the estimated defocus measurement from the second region of the sample and the measured actual defocus for the first region of the sample; and
    provide the second focus adjustment to the imaging system for use in imaging the sample at the subsequent region according to the second focus adjustment.

11. The system of claim 8, wherein, to generate the focus adjustment for the first region of the sample based on the targeted defocus and the estimated defocus measurement for the second region of the sample, the non-transitory memory is further configured with executable instructions that when executed cause the processor to:
    generate an aggregated defocus from a plurality of defocus measurements including the estimated defocus measurement, the plurality of defocus measurements determined from a corresponding plurality of regions of the sample including the second region; and generate the focus adjustment for the first region based on a difference between the aggregated defocus and the targeted defocus.

12. The system of claim 11, wherein, to generate the aggregated defocus from the plurality of defocus measurements, the non-transitory memory is further configured with executable instructions that when executed cause the processor to:

weight each defocus measurement of the plurality of defocus measurements based on a distance of each corresponding region of the plurality of regions.

13. The system of claim 8, wherein the non-transitory memory is further configured with executable instructions that when executed cause the processor to:

control the imaging system to acquire a plurality of auxiliary images of positions within an initial region adjacent to a region of interest of the initial region;

generate an initial focus adjustment for the region of interest of the initial region based on the plurality of auxiliary images;

control the imaging system to acquire an image of the region of interest of the initial region via a particle beam focused with the initial focus adjustment; and estimate an initial actual defocus for the region of interest of the initial region from the acquired image, wherein the second region comprises the initial region and the estimated defocus measurement from the second region of the sample comprises the initial actual defocus.

14. A method, comprising:

during a single particle analysis session, determining a focus adjustment for an individual foil hole of a plurality of foil holes of a sample based on defocus measurements of other foil holes and a targeted defocus; and acquiring an image of the sample at the individual foil hole with a particle beam focused with the determined focus adjustment.

15. The method of claim 14, further comprising, for an initial foil hole of the plurality of foil holes:

acquiring auxiliary images of the sample within the initial foil hole at positions adjacent to a region of interest of the initial foil hole;

determining an initial focus adjustment for the region of interest of the initial foil hole based on the auxiliary images;

acquiring an image of the region of interest of the initial foil hole via a particle beam focused with the initial focus adjustment; and measuring an actual defocus for the region of interest of the initial foil hole based on the acquired image of the region of interest, wherein the defocus measurements include the actual defocus.

16. The method of claim 14, further comprising, for an initial foil hole of the plurality of foil holes:

acquiring an image of the sample at the initial foil hole with a default focus; and measuring an actual defocus for the initial foil hole from the acquired image of the sample at the initial foil hole, wherein the defocus measurements include the actual defocus for the initial foil hole.

17. The method of claim 14, wherein determining the focus adjustment for the individual foil hole of the plurality of foil holes of the sample based on the defocus measurements of the other foil holes and the targeted defocus comprises:

identifying, for the individual foil hole of the plurality of foil holes, foil holes of the plurality of foil holes within a neighborhood of the individual foil hole;

calculating a defocus for the individual foil hole based on defocus measurements of the foil holes within the neighborhood; and determining the focus adjustment for the individual foil hole based on a difference between the calculated defocus and the targeted defocus.

18. The method of claim 17, wherein calculating the defocus for the individual foil hole comprises calculating a weighted average of the defocus measurements of the foil holes within the neighborhood.

19. The method of claim 17, wherein the plurality of foil holes is located in a grid square of the sample, and the method further comprises excluding foil holes within adjacent grid squares of the sample from the neighborhood.

* * * * *